US006757852B1

(12) United States Patent
Ghassemi et al.

(10) Patent No.: US 6,757,852 B1
(45) Date of Patent: Jun. 29, 2004

(54) SELF RESETTING HIGH SPEED REDUNDANCY CIRCUIT AND METHOD THEREOF

(75) Inventors: Hamed Ghassemi, Austin, TX (US); Dimitris C. Pantelakis, Austin, TX (US); Wai T. Lau, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 608 days.

(21) Appl. No.: 09/610,028

(22) Filed: Jul. 5, 2000

(51) Int. Cl.[7] .......................... G11C 29/00; G06F 12/00
(52) U.S. Cl. ........................................................ 714/711
(58) Field of Search ................................ 714/710, 711; 365/200

(56) References Cited

U.S. PATENT DOCUMENTS

| | | | | |
|---|---|---|---|---|
| 5,491,444 A | * | 2/1996 | McClure | 327/525 |
| 5,610,865 A | * | 3/1997 | Shin et al. | 365/200 |
| 5,617,049 A | * | 4/1997 | Hirano et al. | 327/172 |
| 5,812,467 A | * | 9/1998 | Pascucci | 365/200 |
| 5,862,087 A | | 1/1999 | Lee | 365/200 |
| 5,930,194 A | * | 7/1999 | Yamagata et al. | 365/230.03 |
| 6,205,515 B1 | * | 3/2001 | Huang | 711/104 |
| 6,460,110 B2 | * | 10/2002 | Tomita | 711/1 |

* cited by examiner

Primary Examiner—Albert Decady
Assistant Examiner—Esaw Abraham
(74) Attorney, Agent, or Firm—Robert L. King; Joanna G. Chiu; Timothy E. Buckley (57) ABSTRACT

A memory circuit includes a memory structure having sets of redundant columns where each set of redundant columns can replace a column of the memory array that may include a defective cell. Selection of the redundant columns for a memory access is accomplished by performing an address comparison between the address provided to the memory and one or more predetermined values that indicate which portion of the data array each set of redundant columns replaces. Based on this address comparison, a column redundancy select signal is asserted when a set of redundant columns is selected. For a read operation, the column redundancy select signal propagates through redundant column logic select the appropriate data from a particular set of redundant columns. This redundant data that is selected is substituted for data stored in the memory array for the read operation. A de-select feedback signal is generated based on the column redundancy select signal The de-select feedback signal is self resetting by causing the column redundancy select signal to be de-asserted after a time period adequate for the memory operation to complete.

18 Claims, 5 Drawing Sheets

SELF RESETTING HIGH SPEED REDUNDANCY CIRCUIT AND METHOD THEREOF

FIELD OF THE INVENTION

The invention relates generally to semiconductor memories, and more particularly to a redundancy circuit for a memory and a method thereof.

RELATED ARTS

As semiconductor memory devices continue to evolve, the number of individual bit cells included in the memory devices increases. A larger number of bit cells included in a memory device increases the likelihood of manufacturing faults corrupting one or more bit cells included in the memory device. In order to avoid scrapping an entire memory device due to a problem with a single bit cell, redundancy is often included in memory circuits. Redundancy allows for the replacement of defective bit cells with functional, redundant bit cells that are included in the memory device. As such, the memory will function as expected, and, as a result, production yields for the memory device are significantly increased.

One disadvantage of redundant circuitry in memory devices is the additional delay in signal paths that is introduced by the inclusion of the redundant circuitry. This additional delay can have a detrimental effect on the access time associated with the memory device. Redundant memory cells typically require longer access times than memory cells included in the memory array structures. When the overall access speed of the memory circuit is determined, the worst-case access time is used to characterize the entire memory device. Because the redundant cells included in the memory structure typically have the worst-case access time, this access time will define the overall speed with which the memory structure is expected to operate in a computing system.

When redundant cells are included in a memory structure, a potential for contention on data lines used to write data to and read data from the redundant cells may arise. This contention may be due to the inclusion of pass gates within the redundant cell selection logic. If, during one cycle, a particular redundant memory cell is enabled onto a data line (i.e. drives a state onto the data line), there is a potential for another redundant data cell to be enabled onto the same data line during the next cycle before the first data cell is able to be de-selected such that it stops driving the data line. Such data contention can lead to errors in the data values read from the memory structure. In order to ensure that such data contention is avoided, the decoding circuitry that selects particular redundant cells is skewed to perform de-selection of redundant cells more quickly than selection of redundant cells. In other words, the signal that enabled the first redundant cell to drive the data line must be de-asserted prior to any potential assertion of enabling signals that allow other redundant cells to drive the common data line.

In order to ensure that de-selection of redundant data cells occurs more rapidly than selection of redundant data cells, transistors within the selection circuitry are sized to ensure that the de-selection signals propagate through the circuitry more rapidly. Unfortunately, skewing the decoding circuitry to prefer de-selection generally reduces the speed with which the selection signals can propagate through the circuitry. Slower selection signals result in slower memory access times. As memory cell densities increase and desirable access times continue to decrease, the problems associated with the additional delays due to redundant cells become more prevalent.

Therefore, a need exists for a memory redundancy circuit that does not degrade overall memory performance.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Generally, the present invention provides a memory circuit that includes redundant circuitry and a method for use of such redundant circuitry. The redundant circuitry includes a feedback path such that potential data contention issues are avoided. The memory structure includes a number of sets of redundant columns where each set of redundant columns can replace a column of the memory array that may include a defective cell. Selection of the redundant columns for a memory access is accomplished by performing an address comparison between the address provided to the memory and a set of fuses that have been configured to indicate which portion of the data array each set of redundant columns replaces. Based on this address comparison, a column redundancy select signal is asserted when a set of redundant columns is selected. For a read operation, the column redundancy select signal propagates through redundant column logic to select the appropriate data from a particular set of redundant columns. This redundant data that is selected is substituted for data stored in the memory array for the read operation. After data has been read out, a de-select feedback signal is generated based on the column redundancy select signal. The de-select feedback signal causes the column redundancy select signal to be de-asserted (self-reset) after the amplifier selection signal is valid. As such, the selection of redundant columns is terminated prior to the end of the cycle in which selection occurs. As a result, no data contention exists or will happen during the subsequent cycle if redundant data corresponding to a different set of redundant columns is selected. It should be recognized that the reset method taught herein does not use a fixed time period to deassert the column redundancy select signal as that technique is slow to ensure that reliable data is captured.

By forcing redundant column selection to be terminated prior to the end of a cycle, the skewing of decoding logic to ensure rapid de-selection is no longer required. As such, the skewing can be directed towards improving selection speed of the redundant cells included in the memory circuit. This leads to faster access times for the redundant data, which in turn leads to faster overall memory access times.

Figure 1:
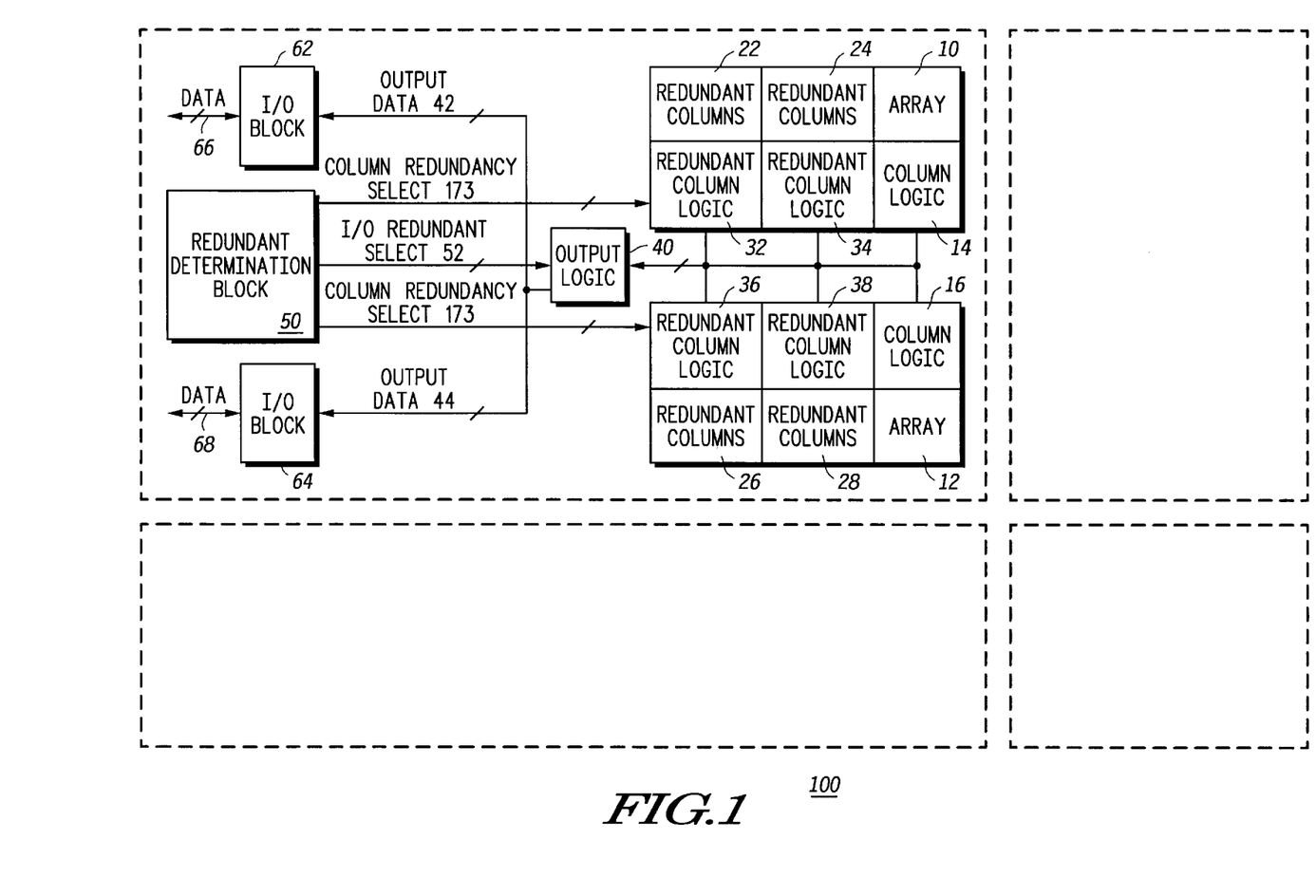
FIG. 1 includes an illustration of a block diagram of a memory structure in accordance with a particular embodiment of the present invention.

The invention can be better understood with reference to FIGS. 1–5. FIG. 1 includes a block diagram of a memory structure 100. The memory structure 100 is divided into four quadrants, and additional detail is provided for the upper left quadrant. It is assumed that each of the other quadrants is structured in a similar manner to the upper left quadrant. In one embodiment, each of the quadrants may include 1 Megabits (M) of memory, such that the overall memory structure provides a total storage capacity of 4 M. In other embodiments, each of the quadrants may include 2 M, 4 M, etc. Within the upper left quadrant illustrated, the arrays 10 and 12 store the majority of the data for that particular quadrant. As such, in an embodiment where the quadrant stores 1 M of data, each of the arrays 10 and 12 store one-half of 1 M.

The column logic blocks 14 and 16 are used to select particular portions of the arrays 10 and 12, respectively, based on address and control signals received by the memory structure. In the case where the memory structure 100 produces 36 bits of output data per memory read access, each of the quadrants is responsible for producing 9 bits of the total 36 bits of output data generated. It should be well understood that memory structure 100 could provide any number of bits other than the example given here. In such an example, during a read cycle one of the arrays 10 and 12 generates 9 bits of data that may be provided as the output for the upper-left quadrant. The column logic blocks 14 and 16 make the determination as to which of the arrays 10 and 12 provides these 9 bits.

In order to provide redundancy within the memory structure 100, each of the quadrants includes a number of sets of redundant columns. In the embodiment illustrated in FIG. 1, each quadrant includes four sets of redundant columns. The upper left quadrant includes the four sets of redundant columns 22, 24, 26 and 28. Each of these sets of redundant columns includes a number of columns equivalent to a column set that is referenced within each of the arrays 10 and 12 based on a certain number of the address signals. A predetermined number of columns are included within each set of columns, and additional address signals are used to select a column from the set of columns, where the selected column is used to provide a portion of the read data for a read operation. For a write operation, the address signals select the column set and particular column within that set to which the write data is written. The selection of a particular column in each set of redundant columns is accomplished using a corresponding redundant column logic block 32, 34, 36, and 38 and redundant determination block 50 which decodes a portion of the address signals received by the memory 100. Thus, a redundant memory column included in one of the sets of redundant columns 22, 24, 26, and 28 can be used in lieu of a normal memory column included in the one of the arrays 10 and 12 when a defect is included in the normal memory column.

During a Read operation, an output logic block 40 receives the data generated by the arrays 10 and 12 and one of the sets of redundant columns 22, 24, 26, and 28, and selects the output data 42 and 44 provided to the input/output (I/O) blocks 62 and 64 during a particular cycle. During a particular cycle, only one of the arrays 10 and 12 provides data bits to the output logic block 40. Similarly, due to the redundant column selection circuitry included within the memory structure 100, data is only provided to the output logic block 40 from one of the sets of redundant columns 22, 24, 26, and 28 during a particular cycle, and this only occurs when a determination is made that a portion of the desired data is stored in that particular set of redundant columns.

The output data 42 is provided to the I/O block 62, which drives the data onto the bidirectional data signals 66. Similarly, the output data 44 is provided to the I/O block 64, which drives the data onto the bidirectional data signals 68. Each of the I/O blocks 62 and 64 is responsible for driving a portion of the data lines corresponding to the quadrant. In one example, I/O block 62 may drive 5 data lines and I/O block 64 may drive the remaining 4 data lines for a 9-bit quadrant. The bidirectional data signals 66 and 68 are also used to receive data corresponding to write operations for the memory structure 100. The data paths and logic associated with the write operations are not specifically illustrated in the diagram of FIG. 1. However, based on the teachings provided herein, one of ordinary skill in the art can readily include the write circuitry necessary to allow for write operations to occur to locations either in the data array 10 and 12 or the sets of redundant columns 22, 24, 26, and 28.

For a read operation, in order to determine whether redundant data stored in one of the sets of redundant columns 22, 24, 26, and 28 is to be provided as a portion of the output data 42 or 44 in place of data stored within one of the arrays 10 and 12, a redundancy determination block 50 is included in the memory structure 100. The redundancy determination block 50 performs a number of operations that are described in additional detail with respect to FIGS. 2 and 3 below. Primarily, the redundancy determination block 50 is responsible for performing the address comparisons associated with determining whether data stored in redundant cells should be utilized to derive a portion of the output data 42 and 44. A similar determination is made for a write operation to determine whether a portion of the write data is to be stored in one of the sets of redundant columns 22, 24, 26, and 28.

When redundant cells are to be utilized in a memory operation, the redundancy determination block 50 generates the appropriate column redundancy select signal 173 that is used for selecting redundant cells. The column redundancy select signal 173 also initiates the generation of a de-select feedback signal 142 that ensures the selection of redundant cells is terminated prior to the end of the cycle. Termination of cell selection before the end of the cycle ensures that there are no data contention problems in the subsequent cycle.

Although the upper left quadrant of the memory structure 100 has been described in detail, the structure and functionality of each of the other quadrants is similar. As stated above, each of the other quadrants produces different portions of the complete set of data signals generated by the memory structure 100 during a read operation. Similarly, each of the other quadrants is responsible for determining the appropriate cells (redundant or in an array) in which to store a portion of the write data bits provided to the memory 100 during a write operation.

Although the sets of redundant columns 22 and 24 are shown positioned adjacent to the array 10, cells included in the sets of redundant columns 22 and 24 may be used to replace defective cells included in either of the arrays 10 or 12. Similarly, cells in the sets of redundant columns 26 may be used to replace defective cells included in either of the arrays 10 or 12. Each quadrant includes a number of sets of redundant columns that may be universally applied to any of the sets of columns included in the data arrays for the memory quadrant. In other embodiments, the data array for a particular quadrant may be a uniformly addressed array that is not be separated into two separate arrays, such as the arrays 10 and 12 shown in FIG. 1. Although the arrangement illustrated in FIG. 1 can provide advantages in terms of reduction in lengths of various circuit-level signal lines for each quadrant, other layout configurations may be utilized.

In yet other embodiments of the present invention, a memory structure that only includes a single array, or a set of arrays such as those shown for the upper-left quadrant of the memory structure 100 may utilize the techniques described herein in order to provide redundancy in a manner that avoids data contention and improves memory access timing. As is apparent to one of ordinary skill in the art, numerous memory configurations are possible that benefit from the teachings provided herein, and therefore, the application of the teachings provided herein is not limited to any particular memory configuration.

Figure 2:
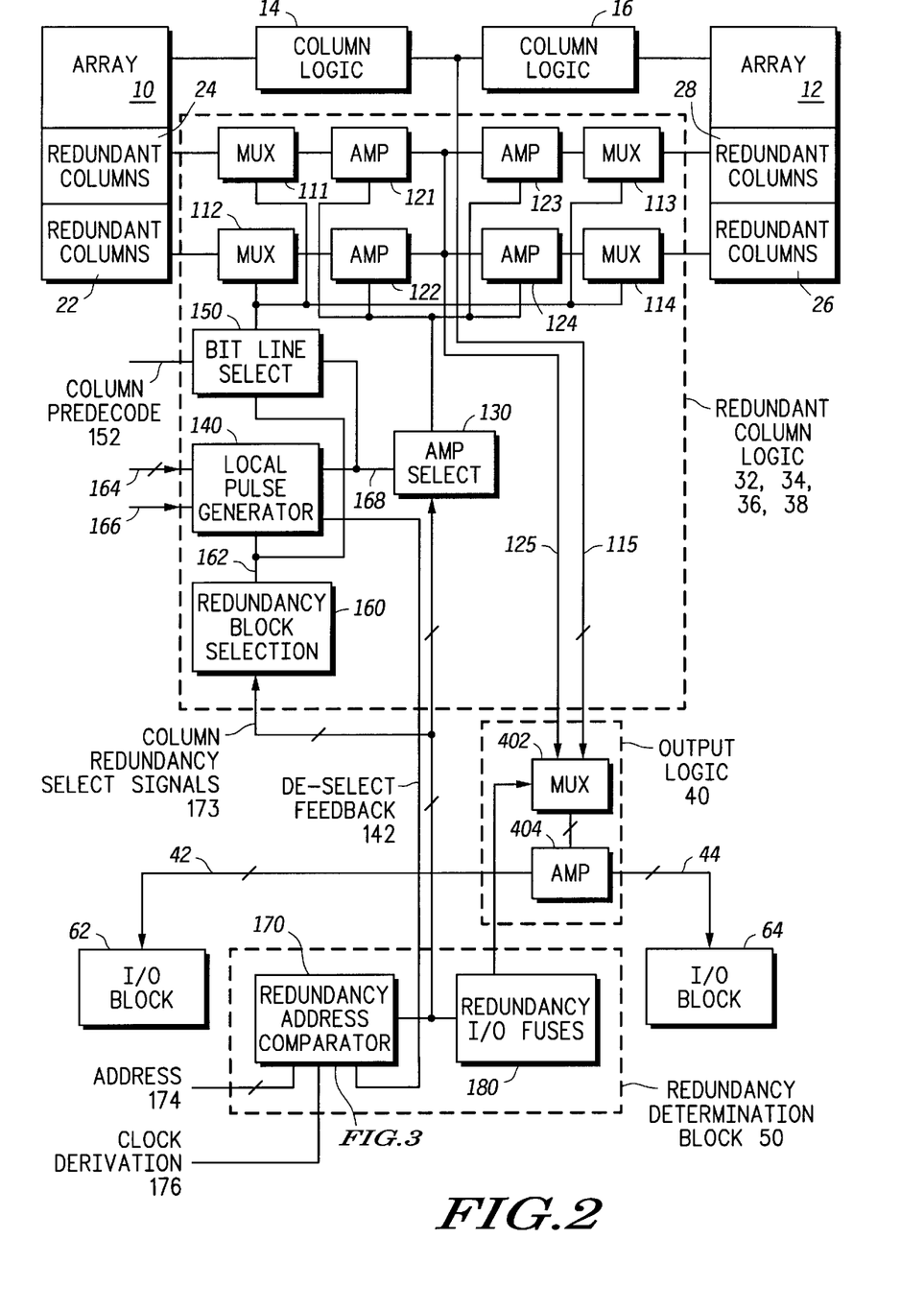
FIG. 2 illustrates a more detailed view of a quadrant portion of the memory of FIG. 1 in accordance with a particular embodiment of the present invention.

FIG. 2 illustrates a block diagram of the upper left quadrant of the memory structure 100 of FIG. 1 in additional detail. The redundancy determination block 50 includes a redundancy address comparator 170 and redundancy I/O fuses 180. The redundancy I/O fuses 180 are described in additional detail with respect to the generation of the output data 42 and 44 below.

For each memory operation, the redundancy address comparator 170 receives address signals 174 that correspond to a particular set of columns included within the quadrant. The redundancy address comparator 170 determines, based on both address signals 174 and the predetermined output values of fuses 501–506, whether redundant cells stored within the sets of redundant columns 22, 24, 26, or 28, are to be used for the memory operation.

Additional description regarding the redundancy address comparator 170 is presented with respect to FIG. 3 below. In general, the redundancy address comparator 170 compares the received address 174 with a set of comparison values corresponding to each of the sets of redundant columns 22, 24, 26, and 28. The comparison values for each set of redundant columns are preferably derived based on a set of fuses corresponding to each set of redundant columns that is included in the redundancy address comparator. Thus, during testing associated with manufacturing of the memory device, if a defect is located in one of the arrays 10 and 12, the redundant circuitry can be enabled such that redundant memory cells included in one or more of the sets of redundant columns 22, 24, 26, and 28 are used to replace the defective cells in the memory arrays 10 and 12.

If the redundancy address comparator 170 determines that the address 174 corresponds to an address for which redundant circuitry is being used, the redundancy address comparator 170 asserts a column redundancy select signal that corresponds to a particular one of the sets of redundant columns 22, 24, 26, and 28. The set of column redundancy select signals 173 corresponding to all of the sets of redundant columns 22, 24, 26, and 28 are provided to the redundancy block selection block 160. If the redundancy block selection block 160 determines that any of the column redundancy select signals 173 are asserted, it can initiate operations that enable data to be read out of one of the sets of redundant columns for a read operation, or enable data to be written to one of the sets of redundant columns for a write operation. The redundancy block selection block 160 provides a redundancy indication 162 to the local pulse generator 140 and the bit line select block 150.

In addition to the redundancy indication 162, the bit line select block 150 also receives column predecode information 152. Based on the redundancy indication 162 and the column predecode information 152, the bit line select block 150 generates control information provided to the multiplexors 111–114. This control information supplied to the multiplexors 111–114 selects a particular bit line from the bit lines present within each of the sets of redundant columns.

As is the case with many memory structures, the retrieval of data from a memory cell may be enhanced through the use of a bit line and a complementary bit line, which is commonly referred to as bit line bar, where sense amplifiers detect the difference in potential between these two signal lines to resolve the current state of the particular memory cell selected. By using such complimentary signals, the amount of charge required to store state information can be reduced, while still allowing for accurate state detection on the part of sense amplifiers.

The bit line pair selected by each of the multiplexor s 111–114 is provided to a corresponding amplifier 121–124. Each of these amplifiers 121–124 is selectively enabled by the amplifier select block 130. The amplifier select block 130 receives the column redundancy select signals 173 from the redundancy address generator 170, and, based on which of these redundancy select signals is asserted, the amplifier select block 130 enables one of the amplifiers 121–124. For example, if the redundancy address comparator 170 determines that data from the set of redundancy columns 28 is to be used for a read operation, the column redundancy select signal corresponding to that set of redundant columns 28 is asserted. Based on this assertion, the amplifier select block 130 generates a corresponding signal that is provided to the amplifier 123 such that it produces an amplified version of the output of the multiplexor 113 and drives this output onto the redundant output signal line 125. Each of the amplifiers 121–124 may include sense amplifiers that amplify the state of the particular memory cell being read as well as amplification circuitry that amplifies the sensed voltages to produce a greater voltage swing that corresponds to the voltage levels desired in other portions of the memory.

The amplifier selection block 130 receives an amplifier selection enable signal 168 from the local pulse generator 140, where the amplifier selection enable signal 168 and column redundancy select signals 173 determine whether or not one of the amplifiers 121–124 is enabled. The amplifier selection enable signal 168 includes a pulse that is generated based on a number of input signals received by the local pulse generator 140. The local pulse generator 140 receives the redundancy indication 162 from the redundancy block selection block 160 as well as a set of timing configuration signals 164 that control some timing parameters associated with operation of the memory. These timing configuration signals 164 help to ensure that pulses generated by the local pulse generator 140 are appropriate in terms of their duration and time of issuance. The local pulse generator 140 also receives a read indication signal 166, which determines whether or not the local pulse generator 140 generates a pulse on the amplifier selection enable signal 168. If a read operation is occurring, as indicated by the read indication signal 166, one of the amplifiers 121–124 needs to be enabled, and therefore a pulse is generated on the amplifier selection enable signal 168.

In addition to generating control pulses that are provided to the bit line select block 150 and the amplifier select block 130, the local pulse generator 140 also generates a de-select feedback signal 142 that is provided back to the redundancy address comparator 170. The de-select feedback signal 142 is generated to cause the de-assertion of any column redundancy select signals 173 that have been asserted during a particular memory cycle. By forcefully causing de-assertion of column redundancy select signals, any circuitry that has been enabled to drive the output bus structures within the redundant circuitry can be disabled such that the danger of data contention on a subsequent cycle is eliminated. The local pulse generator 140 generates the de-select feedback signal 142 at an appropriate time such that the memory operation that spawned the de-select feedback signal 142 is allowed to progress to completion. The specific timing of the de-select feedback signal 142 is described in additional detail with respect to FIGS. 3–5 below.

The output logic block 40 receives the redundant output signal line 125 as well as an array data bus 115 (which may also be referred to as an internal data bus) sourced by the column logic blocks 14 and 16. For read operations, the array data bus 115 selectively transmits a number of data bits retrieved from one of the arrays 10 and 12 based on the address information received by the memory 100.

The steering multiplexor (MUX) 402 of the output logic block 40 receives data selection signals from the redundancy I/O fuses 180 of the redundancy determination block 50. The redundancy I/O fuses receive the column redundancy select signals 173 and determine, based on a predetermined value stored by a number of pre-programmed fuses, onto which output signal line the redundant data bit carried by the redundant output data signal line 125 (which may also be referred to as an internal data bus) is driven. Thus, a redundant data bit retrieved from a set of redundant columns can be multiplexed onto any one of the outputs driven by the I/O blocks 62 and 64. The resulting output data of multiplexor 402 is provided to an amplifier (AMP) 404, which amplifies these signals to produce output data 42 and 44 that is respectively provided to the I/O blocks 62 and 64. I/O blocks 62 and 64 function to drive the bidirectional data lines 66 of the memory.

Figure 3:
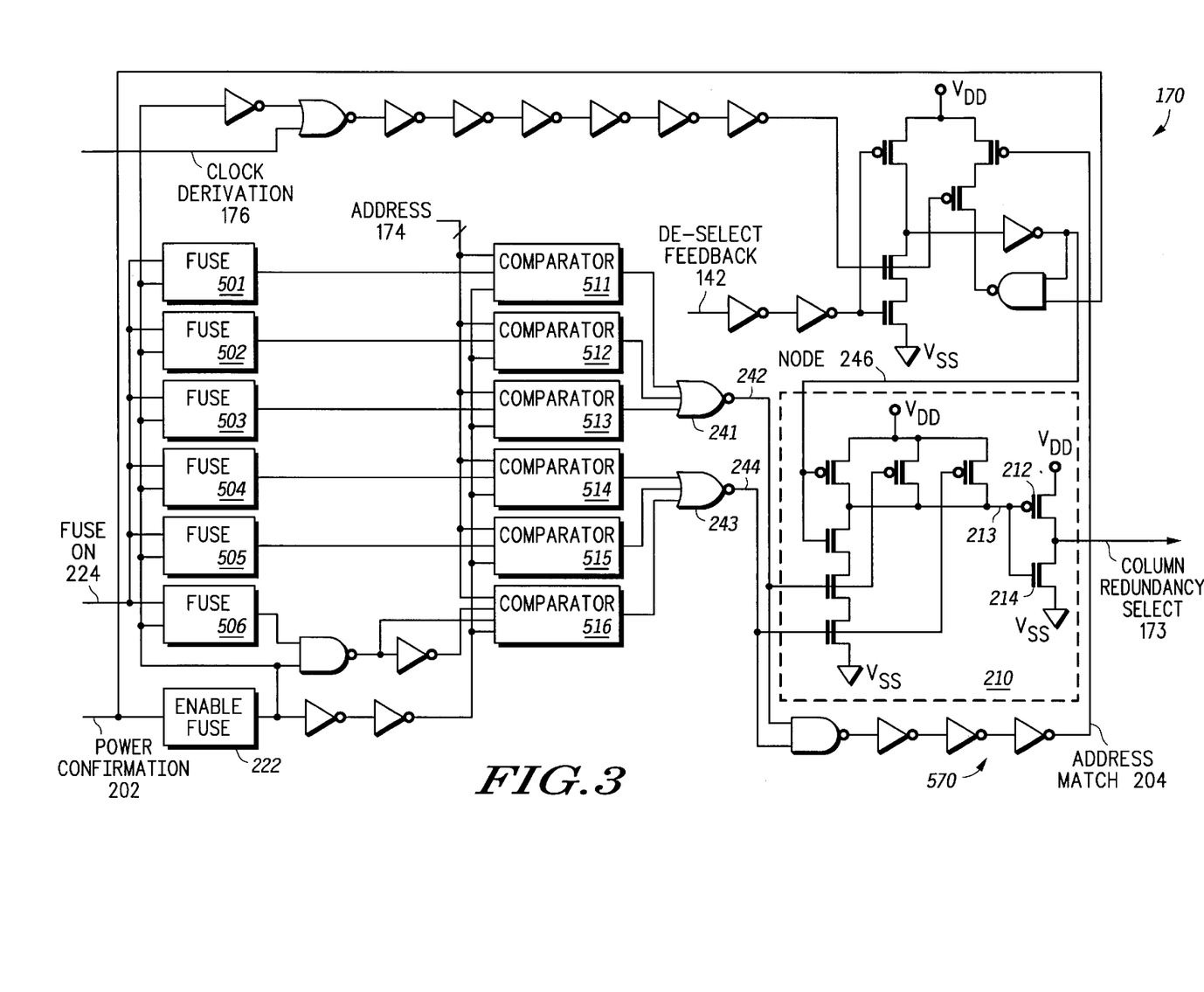
FIG. 3 includes an illustration of a block diagram of the redundancy address comparator included in the circuit of FIG. 2 in accordance with a particular embodiment of the present invention.

FIG. 3 illustrates a block diagram that provides a more detailed view of the functionality of a portion of the redundancy address comparator 170 in accordance with a particular embodiment of the present invention. The circuitry illustrated in FIG. 3 is that corresponding to the generation of a column redundancy select signal 173 of the set of column redundancy select signals 173 described with respect to FIG. 2 above. If four sets of redundant columns are included in the portion of the memory to which the redundancy address comparator 170 corresponds, four sets of circuitry similar to that shown in FIG. 3 is included in the memory portion to allow for selection of the different sets of redundant columns.

In a broad view, the redundancy address comparator includes three portions. A first circuit portion receives the address 174 and a predetermined value (stored in fuses 501–506) and compares these to produce a comparison result signal or signals. A second portion receives the de-select feedback signal 142 and a synchronizing signal (clock derivation 176) and generates an enable signal (at node 246) that is asserted with the synchronizing signal and de-asserted with the de-select feedback signal 142. A third portion receives the comparison result from the first portion and the enable signal from the second portion and applies a predetermined logic function to these two inputs to produce the redundant column select signal 173. In the illustrated example, the predetermined logic function applied by the third portion is an AND function such that when an address match is determined and the enable signal is asserted, the column redundancy select signal is asserted.

A plurality of fuses 501–506 is programmed during testing of the memory structure. An enable fuse 222 is used to control the enablement of redundancy address comparator 170. When a defect is found at a particular cell in the memory array, the fuse pattern is determined such that one of the sets of redundant columns for the memory block is utilized to compensate for the memory defect. As such, the fuses 501–506 store predetermined value used to encode at least a portion of the address of the defective memory cell. A fuse on signal 224 can be used to enable the fuses to drive the comparators with the states that have been programmed into the fuses. The fuse on signal 224 can be selectively enabled such that unnecessary power consumption does not result. Similarly, the power confirmation signal 202 is used to ensure that the circuit is operating at its desired operating voltage and no problems are caused during power up of the device.

The address signals 174 received by the redundancy address comparator are provided to the plurality of comparators 511–516 for comparison with the predetermined value stored using the fuses 501–506. The results of the comparisons are accumulated using the NOR gates 241 and 243 to produce comparison result signals 242 and 244, respectively.

Each of the comparison result signals 242 and 244 is used to control transistors included in the NAND gate portion of the circuitry 210 that produces the column redundancy select signal 173. The circuitry 210 includes a NAND gate that feeds an inverter, where the inverter includes transistors 212 and 214. Note that the NAND gate requires the node 246 to be pulled high before a logic zero can be produced by the NAND gate at its output 213 such that the inversion performed by the transistors 212 and 214 results in a positively asserted column redundancy select signal 173. Therefore, in order for the column redundancy select signal 173 to be asserted high, an address match must be determined by both of the NOR gates 241 and 243, and the node 246 must also be pulled high.

The address match signal 204 is derived from the combination of the outputs of the NOR gates 241 and 243 and indicates that a match has been determined between the fuse values and the address 174 received. The address match signal 204 is provided to the circuitry that drives the node 246 and ensures that the node 246 remains de-asserted when an address match is not determined by the set of comparators 511–516.

The clock derivation signal 176 propagates through the series of inverters and when an address match has been determined, and the clock derivation signal 176 pulls the node 246 to a high state. At the beginning of a cycle, the de-select feedback signal 142, which is derived from the assertion of the column redundancy select signal 173, is inactive, which corresponds to a high state in the implementation shown in FIGS. 3 and 5. As such, the de-select feedback signal 142 does not impede the propagation of the clock derivation signal 176 to the node 246. When the node 246 is pulled high, the chain of NMOS transistors included in the NAND gate of the circuitry 210 provides a path to ground for the output of the NAND gate, thus pulling the output 213 of the NAND gate low. The inverter that includes transistors 212 and 214 then inverts the output 213 of the NAND gate to produce a column redundancy select signal 173 that is asserted high.

As described earlier, the column redundancy select signal 173 propagates into the redundant column logic. The local pulse generator 140, which is described in additional detail with respect to FIG. 4 below, receives the column redundancy select signal 173 and causes the de-select feedback signal 142 to be generated. When the de-select feedback signal 142 is asserted, this causes the logic driving the node 246 to de-assert the node 246 such that a logic low level is provided to the input of the NAND gate in the circuit block 210. As such, the NAND gate produces a high output which, when inverted, de-asserts the column redundancy select signal 173. In other embodiments, some other means for de-asserting the enable signal (at node 246) may be included such that the column redundancy select signal 173 can be disabled if the de-select feedback signal 142 does not cause de-assertion of the enable signal.

Thus, assertion of the column redundancy select signal 173 starts a chain of events that eventually causes subsequent de-assertion of the column redundancy select signal 173. As such, the de-assertion within the memory cycle within which assertion occurs is ensured. This eliminates the potential for data contention during the subsequent cycle. As such, the transistors included in the generation of the column redundancy select signal 173 can be skewed to favor the assertion of the column redundancy select signal 173 as opposed to its de-assertion, which was necessary in prior art memory structures to ensure no data contention would occur during the subsequent memory cycle.

For example, the PMOS transistor 212 included in the inverter that drives the column redundancy select signal 173 can be sized to be much more powerful in terms of drive strength than the NMOS transistor 214 included in the inverter structure. As such, when the column redundancy select signal 173 is to be asserted, more current can be sourced by the PMOS transistor 212 such that the column redundancy select signal 173 is able to propagate through the redundant column logic more quickly. As such, the desired data will be provided on the outputs of the memory more quickly, and the memory access time associated with the read operation will be reduced.

As is apparent to one of ordinary skill in the art, the sizing of the transistor 212 can be complemented by increasing the sizes of the NMOS transistors included in the serial chain within the NAND gate such that they are able to pull down the input to PMOS transistor 212 more rapidly. This propagation of transistor sizing to skew the circuit towards a preference for assertion of the selection signals can be carried as far as is desired to improve overall speed of operation. Similarly, subsequent stages that utilize the column redundancy select signal 173 (the redundancy selection block 160, the amplifier select block 130, the local pulse generator 140, etc.) can increase the sizes of transistors associated with selecting data for output rather than those transistors associated with de-selecting that data.

Figure 4:
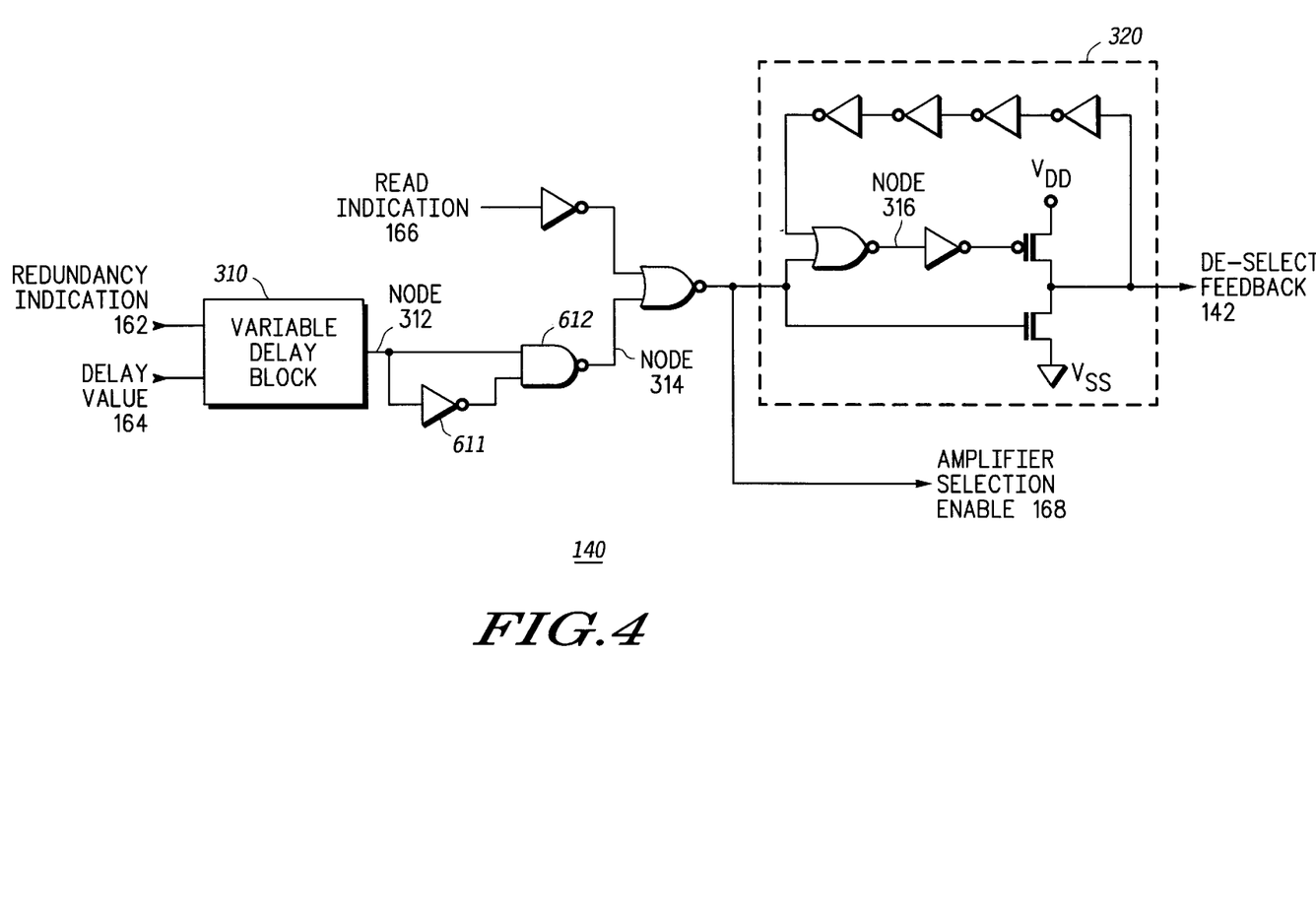
FIG. 4 includes an illustration of a block diagram of the local pulse generator block included in the circuitry of FIG. 2 in accordance with a particular embodiment of the present invention.

FIG. 4 illustrates a more detailed circuit diagram of the local pulse generator 140 in accordance with a particular embodiment of the present invention. The local pulse generator 140 receives the redundancy indication 162 generated by the redundancy block selection block 160. As described above, the redundancy indication 162 is asserted when any one of the column redundancy select signals 173 is asserted. In one embodiment, the local pulse generator 140 also receives a delay value 164 that is used in conjunction with a variable delay block 310 to delay the redundancy indication 162 by a delay that is configurable based on the delay value 164. Such a configuration may allow for fine-tuning of timing parameters after the manufacture of the memory structure. Initially, the delay value 164 may be set to a conservative default level, and if it is determined based on testing that the memory structure 100 can operated at faster speeds, the delay value 164 may be modified by the programming of fuses to allow the redundancy circuitry to operate at a higher speed. This can result in an increase in the overall speed with which the memory structure 100 operates.

The signal present at the node 312 is equivalent to the redundancy indication 162 delayed by the delay determined based on the delay value 164. The logic gates 611 and 612 convert the state of the signal present on the node 312 to a pulse produced at the node 314. Thus, in response to an active high assertion at the node 312, an active low pulse is generated at the node 314. The pulse generated at node 314 is gated with a derivation of the read indication signal 166 to produce the amplifier selection enable signal 168. The read indication 166 may be used in some embodiments of the present invention to distinguish between read operations and write operations occurring within the memory structure 100. In other embodiments, a similar block to that illustrated in FIG. 4 may be included in each quadrant to generate a de-select feedback signal to be used in conjunction write operations. In yet other embodiments, a universal de-select feedback signal generation block may be present that does not gate the pulse generated at the node 314 with either a signal corresponding to a read indication, or a signal corresponding to a write indication, where the de-select feedback signal generated by such a circuit can be used for both types of operations.

The amplifier selection enable signal 168 is used as described earlier to instruct the amplifier select block 130 to cause one of the amplifiers 121–124 to amplify the data signal selected by its corresponding muliplexor for use by the output logic block 40. The amplifier selection enable signal 168 may also be provided to the bit line select block 150 to ensure that the selection controlled by the bit line select block 150 is terminated once the respective amplifier has passed the amplified data to the output logic block 40.

The de-select feedback signal 142 is derived from the amplifier selection enable signal 168 within the local pulse generator 140. The circuit block 320 allows the de-select feedback signal 142 to be asserted for a limited time period, where the limited time period is adequate to ensure that the column redundancy select signal which triggered assertion of the de-select feedback signal 142 is de-asserted. The node 316 has been labeled to correspond to the discussion below of the timing diagram included in FIG. 5.

Figure 5:
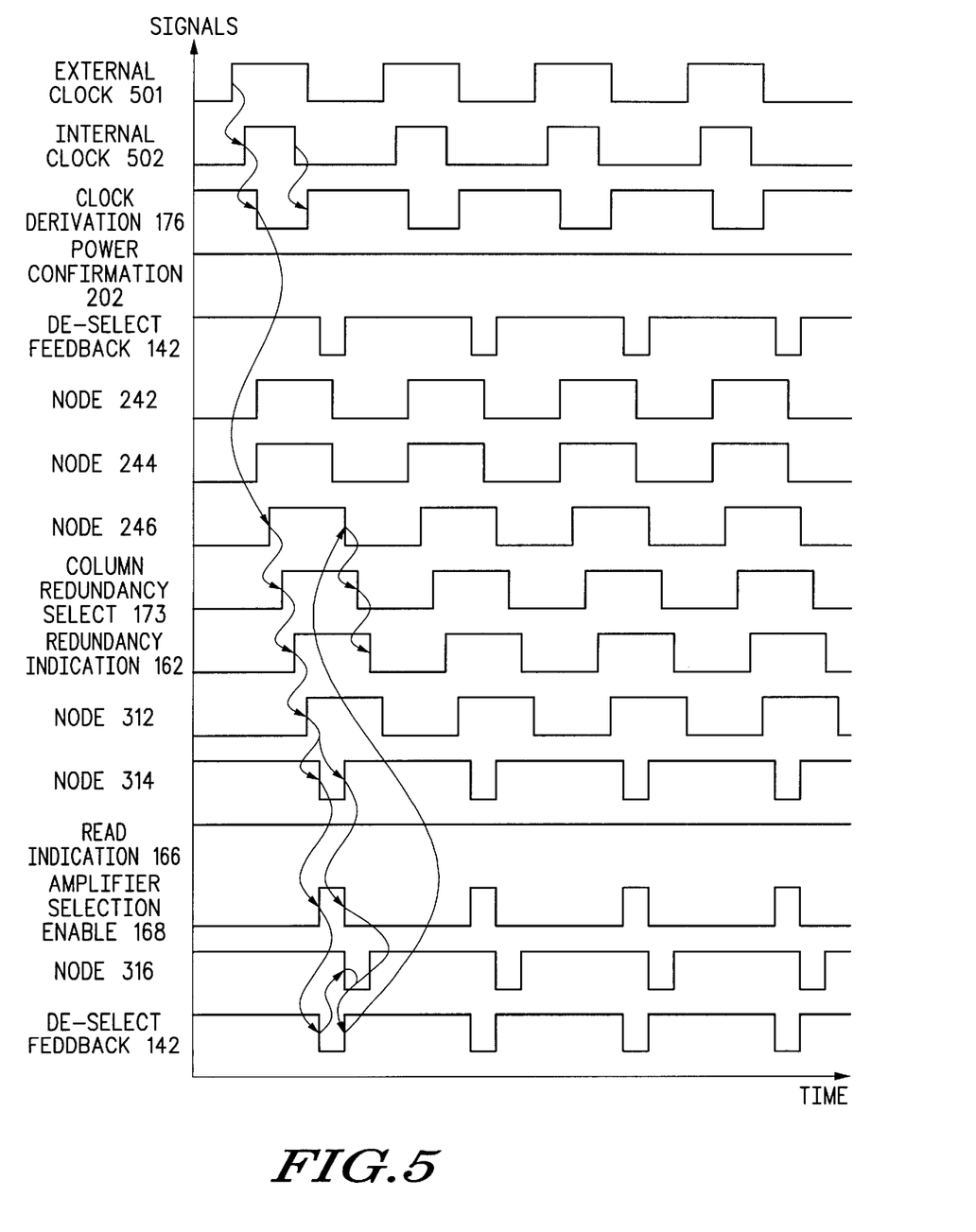
FIG. 5 includes an illustration of a timing diagram associated with an example memory access using the circuit illustrated in FIG. 2 in accordance with a particular embodiment of the present invention.

FIG. 5 illustrates a timing diagram associated with the propagation of various signals throughout the circuitry described with respect to FIGS. 2–4 above. The timing diagram includes an external clock signal 501 that may be the clock signal provided to the memory structure 100. This external clock may be buffered and shaped to generate the internal clock signal 502. The arrows included in the timing diagram of FIG. 5 indicate dependency from the signal to which the arrow is directed upon the signal from which the arrow originated. Thus, the first edge of the internal clock signal 502 is derived from the first edge of the external clock signal 501.

As can be seen from the remaining signals included in the timing diagram of FIG. 5, the column redundancy select signal 173 is asserted following completion of the comparison of the address 174 with the fuses 501–506, which is indicated by the nodes 242 and 244. The column redundancy select signal 173 then propagates through the redundant column logic and results in generation of various other control signals utilized within the redundant column logic.

Eventually, the de-select feedback signal 142 is asserted, which propagates back to the redundant address comparator 170 and causes the column redundancy select signal 173 to be de-asserted. As is shown in the timing diagram, de-assertion of the column redundancy select signal 173, which corresponds to the de-selection of the redundant column logic associated with driving the redundant data bus, occurs prior to the next rising edge of the internal clock signal 502, which may correspond to the initiation of the next memory operation. As such, selection of a different portion of the redundant memory logic included in the circuit during the following operation cannot result in any data contention within the redundant circuitry. As such, the transistors associated with selecting the appropriate portions of the redundant circuitry to generate the desired redundant data can be skewed to provide such selection very rapidly, which in turn results in faster memory access times.

Although the majority of the discussion provided thus far concerns read operations for the memory structure 100, write operations that utilize portions of the redundant circuitry also occur. The timing associated with such write operations is not as crucial to the speed characterization of the overall memory structure 100, and as such the specific paths through which various signals propagate for write operations may be less important than those associated with read operations. However, in order to ensure that data contention within the redundant circuitry does not occur during a read cycle that follows a write cycle, the write cycle must also make certain that any redundant logic that it selects for the write operation is de-selected before the end of its respective cycle. As such, when the read operation commences in the subsequent cycle, the skewed selection circuitry does not cause the selection signals to propagate through the redundant logic so quickly that data contention could result.

In order for write operations to de-assert the respective portions of the redundant logic that the write operations utilize, a similar de-select feedback signal as that described with respect to the read operations above is generated and provided back to the redundant address comparator 170. As is apparent to one of ordinary skill in the art, write operations do not include the generation of control signals that drive the redundant output signal line 125, but rather cause data provided on an input data bus provided to one of the sets of redundant columns 22, 24, 26, or 28 to be stored within one or more selected memory cells within the particular set of redundant columns block selected. Additional differences between write and read operations are apparent to one of ordinary skill in the art.

In the foregoing specification, the invention has been described with reference to specific embodiments. However, one of ordinary skill in the art appreciates that various modifications and changes can be made without departing from the scope of the present invention as set forth in the claims below. For example, it should be well understood that the memory taught herein may be implemented as a stand-alone memory or as a component in a VLSI (very large scale intetration) integrated circuit. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory with redundancy comprising:
   one or more arrays of memory cells, each of the one or more arrays having one or more columns of redundant memory cells;
   a redundancy address comparator coupled to each of the one or more arrays of memory cells, the redundancy address comparator receiving an address which is compared to a predetermined value to determine if redundancy is to be selected within the memory, the redundancy address comparator asserting a redundant column select signal for use in selecting a redundant memory column in lieu of a normal memory column when redundancy is to be activated; and
   logic circuitry coupled to the redundancy address comparator for receiving the redundant column select signal, the logic circuitry selecting redundant data in response to receiving the redundant column select signal and generating a de-select feedback signal to the address comparator which de-asserts the column select signal.

2. The memory of claim 1 wherein the predetermined value is a fuse configuration comprised of a plurality of fuse circuits.

3. The memory of claim 1 wherein the redundancy address comparator further comprises
   a first circuit portion which receives the address and the predetermined value and provides a comparison result signal in response to comparing the address with the predetermined value;
   a second circuit portion which receives the de-select feedback signal and a synchronizing signal, and provides an enable signal which is asserted with the synchronizing signal and de-asserted with the de-select feedback signal; and
   a third circuit portion which receives the comparison result signal and the enable signal and applies a predetermined logic function to the comparison result signal and the enable signal to provide the redundant column select signal in response thereto.

4. The memory of claim 3 further comprising:
   means coupled to the first circuit portion and the third circuit portion for de-asserting the enable signal if the de-select feedback signal does not.

5. The memory of claim 3 wherein the third circuit portion applies an AND logic function to the comparison result signal and the enable signal.

6. The memory of claim 3 wherein the third circuit portion further comprises transistors for implementing the predetermined logic function, the transistors being physically sized to permit assertion of the redundant column select signal to occur faster than de-assertion of the redundant column select signal.

7. The memory of claim 6 wherein the transistors of the third circuit portion are physically sized by using transistors of two conductivity types and by making transistors of a first conductivity type have current driving capability larger than current driving capability of transistors of a second conductivity type.

8. The memory of claim 1 wherein the logic circuitry further comprises:

pulse generation circuitry for receiving the redundant column select signal and providing a pulse signal in response thereto, the pulse signal being used to generate both the de-select feedback signal and a redundancy column enable signal for enabling either a read function or a write function of a predetermined redundant column.

9. The memory of claim 1 further comprising:

a first internal data bus coupled to the one or more arrays of memory cells, excluding the one or more columns of redundant memory cells, for selectively transmitting data from the one or more arrays of memory cells in response to receipt of the address;

a second internal data bus coupled to the one or more columns of redundant memory cells, for selectively transmitting data from the one or more columns of redundant memory cells in response to receipt of the address; and a steering multiplexor coupled to the first internal data bus and the second internal data bus, the steering multiplexor selecting one of the data from the one or more arrays of memory cells or the data from the one or more columns of redundant memory cells in response to the redundant column select signal.

10. The memory of claim 1 wherein the redundant column select signal is used to select a redundant column to which write data is written.

11. The memory of claim 1 wherein the redundant column select signal is used to select a redundant column from which read data is read.

12. A method of implementing redundancy in a memory, comprising the steps of:

providing one or more arrays of memory cells, wherein one or more columns of redundant memory cells are provided in at least one of the one or more arrays of memory cells;

comparing a predetermined value with an input address to determine whether redundancy should be invoked in the memory;

asserting a redundancy column select signal in response to invoking redundancy in the memory; and coupling the redundancy column select signal to logic circuitry that uses the redundancy column select signal to select a predetermined redundant column and uses the redundancy column select signal as a feedback mechanism to reset itself.

13. The method of claim 12 further comprising the steps of:

generating a de-select signal as the feedback mechanism;

generating a comparison result signal in response to the step of comparing; and using the de-select signal, a clock signal, and the comparison result signal to both enable and reset the redundancy column select signal.

14. The method of claim 13 further comprising the step of:

implementing use of the de-select signal, the clock signal, and the comparison result signal with a transistor circuit having transistors of two conductivity types and making transistors of a first conductivity type have current driving capability larger than current driving capability of transistors of a second conductivity type in order to improve speed of operation of selection of redundant columns.

15. The method of claim 12 further comprising the step of:

sizing at least one selection transistor which performs a selection function in at least one of a redundancy block selection portion, a pulse generator portion, and an amplifier selection portion to have greater driving capability than transistors performing a decode function in the memory.

16. The method of claim 12 further comprising the step of:

using the redundancy column select signal to select between coupling a normal memory column or a redundant memory column to an input/output drive circuit.

17. A memory with redundancy circuitry, the memory comprising:

one or more arrays of memory cells, each of the one or more arrays having one or more columns of redundant memory cells;

a redundancy address compare stage coupled to each of the one or more arrays of memory cells, the redundancy address compare stage receiving an address which is compared to a predetermined value to determine if redundancy is to be selected within the memory, the redundancy address compare stage asserting a redundant column select signal for use in selecting a redundant memory column in lieu of a normal memory column when redundancy is to be activated; and a pulse generator coupled to the redundancy address comparator for receiving the redundant column select signal, the pulse generator providing an enable signal which is used for selecting an addressed redundant memory column and reading or writing contents of the addressed redundant memory column, the pulse generator providing a de-assert signal a predetermined delay period after receiving the redundant column select signal;

wherein the redundancy address compare stage receives the de-assert signal which functions to automatically self-reset the redundant column select signal and de-assert the redundant column select signal.

18. The memory of claim 17 wherein the redundancy address compare stage receives a clock signal used to synchronize at least a portion of signals included in the memory.

* * * * *